(12) United States Patent
Chen et al.

(10) Patent No.: US 6,744,083 B2
(45) Date of Patent: Jun. 1, 2004

(54) SUBMICRON MOSFET HAVING ASYMMETRIC CHANNEL PROFILE

(75) Inventors: Xiangdong Chen, New Paltz, NY (US); Sanjay Kumar Banerjee, Austin, TX (US)

(73) Assignee: The Board of Regents, The University of Texas System, Austin, TX (US)

(*) Notice: Subject to any disclaimer, the term of this patent is extended or adjusted under 35 U.S.C. 154(b) by 0 days.

(21) Appl. No.: 10/263,111

(22) Filed: Oct. 1, 2002

(65) Prior Publication Data

US 2003/0116792 A1 Jun. 26, 2003

Related U.S. Application Data

(60) Provisional application No. 60/342,957, filed on Dec. 20, 2001.

(51) Int. Cl.$^7$ .............................................. H01L 29/768
(52) U.S. Cl. .................. 257/219; 257/220; 257/221
(58) Field of Search ............................ 257/219–221

(56) References Cited

U.S. PATENT DOCUMENTS

| | | | | |
|---|---|---|---|---|
| 5,293,052 A | * | 3/1994 | Cherne et al. ............... | 257/349 |
| 5,830,788 A | * | 11/1998 | Hiroki et al. ............... | 438/199 |
| 6,255,174 B1 | * | 7/2001 | Yu ............................... | 438/286 |
| 2002/0030227 A1 | * | 3/2002 | Bulsara et al. ............... | 257/346 |

OTHER PUBLICATIONS

Lundstrom, M., "Elementary Scattering Theory of the Si MOSFET," *IEEE Electron Device Letters*, vol. 18, No. 7, pp. 361–363, Jul. 1997.

Verdonckt–Vanderbroek, S. et al., "SiGe–Channel Heterojunction ρ–MOSFETs," *IEEE Trans. Electron Devices*, vol. 41, No. 1, pp. 90–100, Jan. 1994.

Chen, Xiangdong et al., "An asymmetric Si/Si$_{1-x}$Ge$_x$ channel vertical p–type metal–oxide–semiconductor field–effect transistor," *Solid State Electronics*, vol. 45, pp. 281–285, Jan. 2001.

* cited by examiner

*Primary Examiner*—Allan R. Wilson
(74) *Attorney, Agent, or Firm*—Beyer Weaver & Thomas, LLP

(57) ABSTRACT

A MOSFET semiconductor device having an asymmetric channel region between the source region and the drain region. In one embodiment, the device comprises a mesa structure on a silicon substrate with the source region being in the substrate and the mesa structure extending from the source region and substrate. The asymmetric channel region can include silicon abutting the source region and a heterostructure material such as Si$_{1-x}$Ge$_x$ extending to and abutting the drain region. The mole fraction of Ge can increase towards the drain region either uniformly or in steps. In one embodiment, the doping profile of the channel region is non-uniform with higher doping near the source region and lower doping near the drain region.

15 Claims, 5 Drawing Sheets

SUBMICRON MOSFET HAVING ASYMMETRIC CHANNEL PROFILE

CROSS-REFERENCES TO RELATED APPLICATIONS

This application claims benefit to pending provisional application Serial No. 60/342,957 filed Dec. 20, 2001, which is incorporated herein for all purposes.

BACKGROUND OF THE INVENTION

This invention relates generally to MOSFET transistors, and more particularly the invention relates to MOSFET devices having submicron channels with asymmetric profiles.

There has been intensive investigation of metal-oxide-semiconductor field effect transistors (MOSFETs) below 100 nm. One of the key challenges in scaling of the MOSFET is to improve the drive current without degradation of the short channel performance and off-gate leakage current. Strained $Si_{1-x}Ge_x$ has attracted much attention recently because of the hole mobility improvement in the strained layer, leading to PMOSFET drive current improvement. However, the short channel effects and off state leakage current are also degraded due to the smaller band gap in the $Si_{1-x}Ge_x$ layer.

Suppression of short channel and hot carrier effects without sacrificing drive current is also a key challenge in sub-100 nm devices. Lightly doped drain MOSFETs (LDDS) have been widely used to suppress hot carrier effects. However, the drive capability is also degraded due to high series resistance introduced by the lightly doped drain.

The present invention is directed to providing an improved submicron MOSFET through use of an asymmetric channel profile.

BRIEF SUMMARY OF THE INVENTION

In accordance with the invention, the performance of MOSFETs is significantly improved by incorporating asymmetric channel profiles, either material, doping profile, or both.

In accordance with one embodiment of the invention, band gap engineering is incorporated into the channel of a MOSFET. On the source side, the channel is made of silicon, so the short channel performance is not degraded compared with a silicon device. The rest of the channel is made of strained $Si_{1-x}Ge_x$ so that the hole mobility in the strain $Si_{1-x}Ge_x$ can be utilized.

In accordance with another embodiment of the invention, a graded doping profile is employed in the channel of a MOSFET device. The graded doping in the channel can be formed by in situ doping during chemical vapor deposition or by conventional single step ion implantation. Doping is graded in the channel and higher at the source end, which allows off-state leakage current, drain induced barrier lowering (DIBL) effect and hot carrier effects to be suppressed significantly while the drive current is improved.

The invention and objects and features thereof will be more readily apparent from the following detailed description and appended claims when taken with the drawings.

DETAILED DESCRIPTION OF THE INVENTION

Figure 1A:
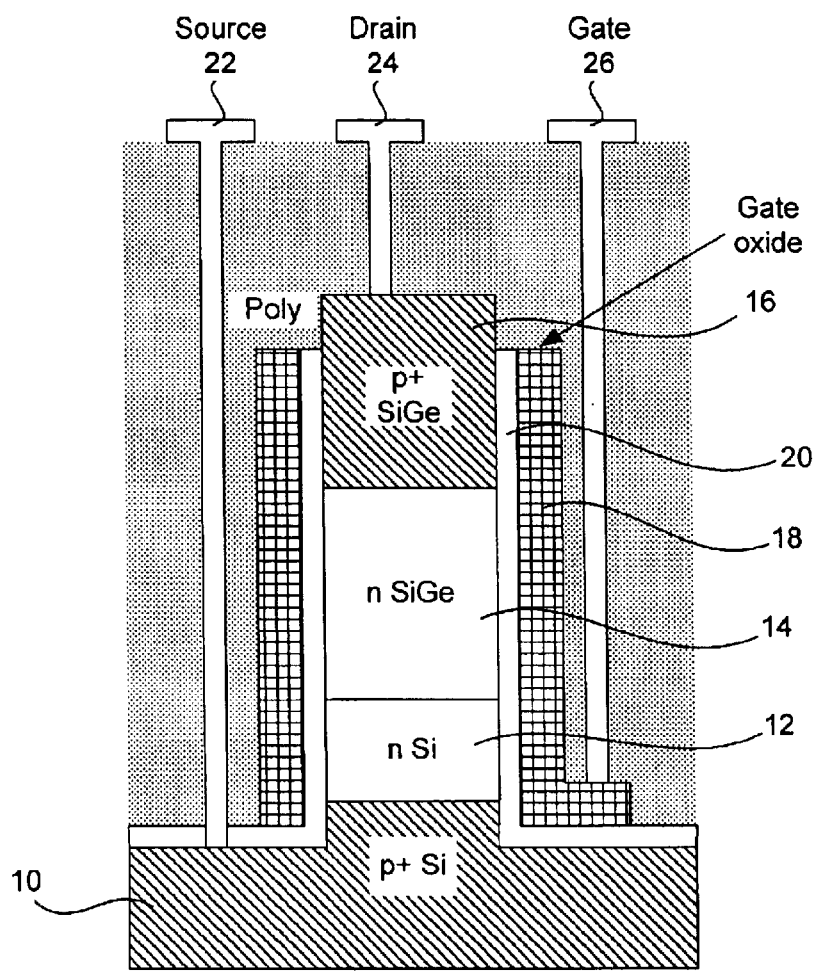
FIG. 1A is a schematic cross section of a vertical asymmetric SiGe channel PMOSFET in accordance with one embodiment of the invention.
Figure 1B:
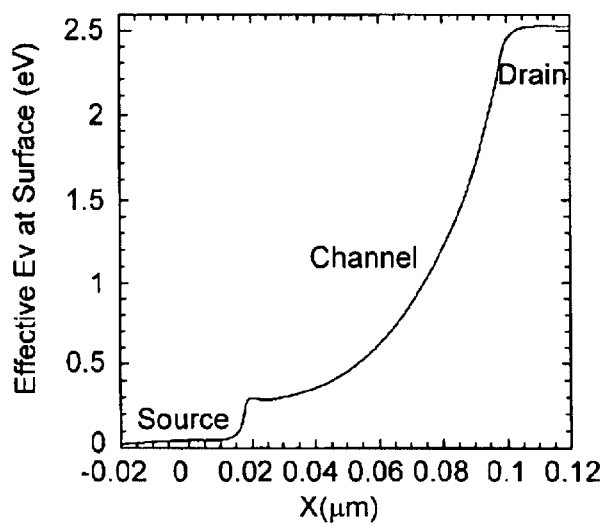
FIG. 1B is an energy band diagram of the device.

FIG. 1 is a section view schematic of a vertical asymmetric $Si_{1-x}Ge_x$ channel PMOSFET in accordance with an embodiment of the invention, and FIG. 2 is an energy band diagram of the device operated at $V_{ds}=V_g=-2V$. The device is a mesa structure with a P+ silicon source region 10, a channel region including N-doped silicon 12 and N-doped SiGe alloy 14, and P+ doped SiGe drain 16. A polysilicon gate region 18 surrounds the channel region 12, 14 with a gate oxide 20 therebetween. Contacts 22, 24, and 26 are made to the source, drain, and gate respectively.

On the source side, the channel is made of silicon, therefore the short channel performance is not degraded compared to a silicon device. The rest of the channel is made of the strained $Si_{1-x}Ge_x$ region 14 so that high hole mobility in this strained SiGe layer is utilized. Due to the valence band offset between the silicon and silicon-germanium in the channel region, there is an energy step in the channel which increases the lateral electric field near the source. At channel lengths below 100 nm, velocity overshoot takes place over a portion of the device. In simulations where the carrier velocity near the drain can reach rather high values in the high field region near the drain, MOSFET currents are mainly controlled by the average velocity near the source end of the channel, and the inversion channel density $Q_i$, which is independent of the drain voltage.

The carrier velocity near the source is determined by the electric field and carrier mobility in the channel region near the source. The mobility of the holes in the source end of the carrier of the asymmetric device is low, compared with a PMOSFET with strained SiGe everywhere in the channel. This drawback can be compensated by the kinetic energy enhancement due to the valence band offset at the source end of the asymmetric device. Due to the potential energy step in the channel, the device shows a larger field gradient near the source end of the channel. Especially at the step, where there is a jump in the electric field, holes injected from the source into the channel will experience a velocity enhancement near the source end. Therefore, the energy step in the channel helps the carrier injection from the source to the channel, and drive current is improved.

Figure 2A:
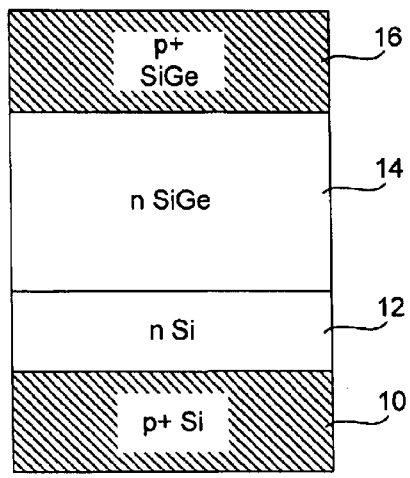
FIGS. 2A–2C are section views illustrating process steps in fabricating the device of FIG. 1A.
Figure 2B:
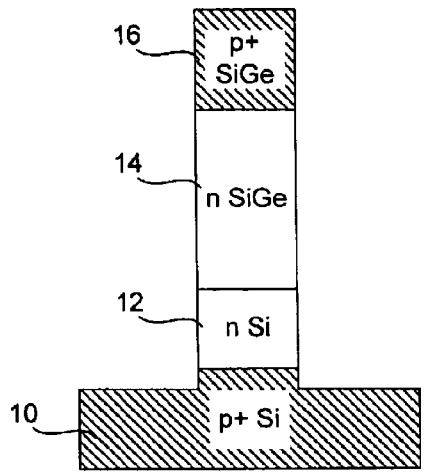
Figure 2C:
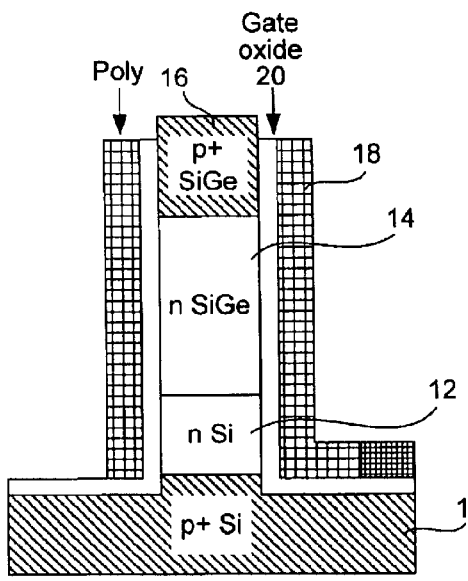

FIGS. 2A–2C are section views illustrating steps in fabricating the device of FIG. 1A. In FIG. 2A molecular beam epitaxy (MBE) or chemical vapor deposition (CVD) is used to grow an in situ doped p+ silicon on an N-silicon (100) substrate to form the source layer 10. An N-type silicon layer and $Si_{1-x}Ge_x$ layer are then grown to be the channel 12, 14. Thereafter, another p+ Si or SiGe layer is grown to be the drain layer 16.

In FIG. 2B a mesa is formed by anisotropic etch after the epitaxial layer growth. The etch stops at the p+ source layer, and then a thin silicon cap layer is grown around the sidewall of the mesa for gate oxidation 20. After gate oxidation, in situ doped p+ polysilicon 18 is grown and etched anisotropically.

Figure 3:
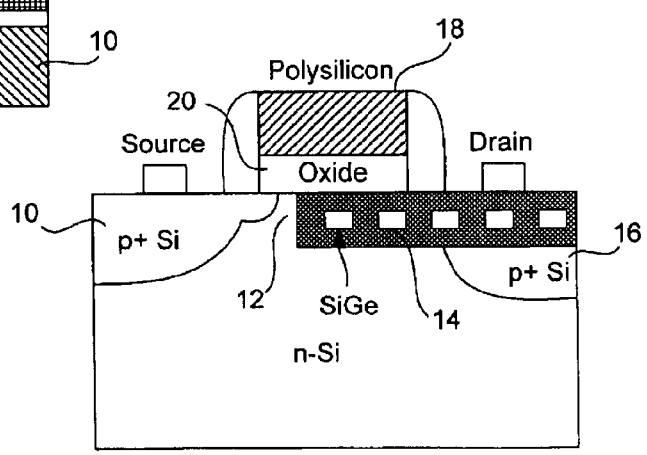
FIG. 3 is a section view of an asymmetric SiGe channel MOSFET in planar format in accordance with an embodiment of the invention.

A similar device can be formed as a planar MOSFET, as shown in the section view of FIG. 3, through the use of selective epitaxial growth of the $Si_{1-x}Ge_x$ material.

Figure 4:
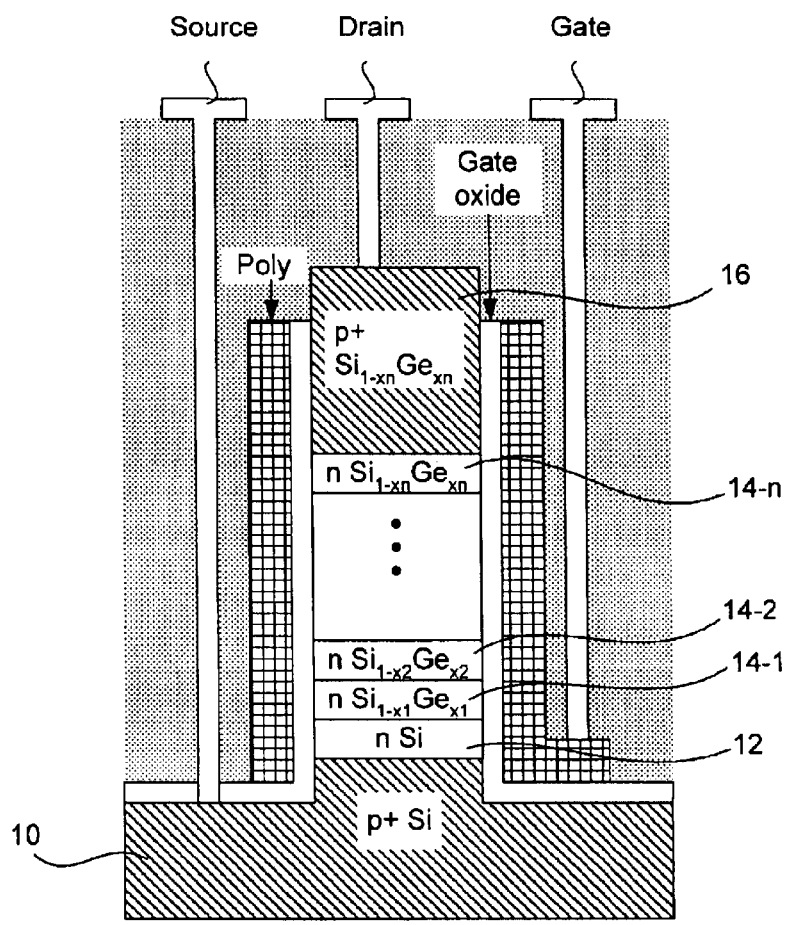
FIG. 4 is a section view schematic of a vertical PMOSFET with a stepped Ge profile in the channel, in accordance with an embodiment of the invention.

To further enhance carrier velocity in the channel and improve the drive current, several small energy steps forming a "staircase" can be put in the channel rather than a single large step, as shown at 14-1 through 14-n in FIG. 4. The Ge profile is like a staircase and the Ge mole fraction is lower near the source and higher near the drain. The carriers in the channel get kinetic energy from the energy step and reach velocity overshoot over most of the channel. It is preferable to keep the step size lower than the optical phonon deformation potential energy to minimize energy loss due to spontaneous emission of optical phonons.

While this embodiment of the invention is directed to Si/$Si_{1-x}Ge_x$ pMOSFETS, the invention can be embodied in both P and N MOSFETs with any suitable heterostructure material systems, such as $Si_{1-x-y}Ge_xC_y$ or $Si_{1-x}C_x$. The invention is also applicable to fully depleted, ultra thin body MOSFETs.

Figure 5:
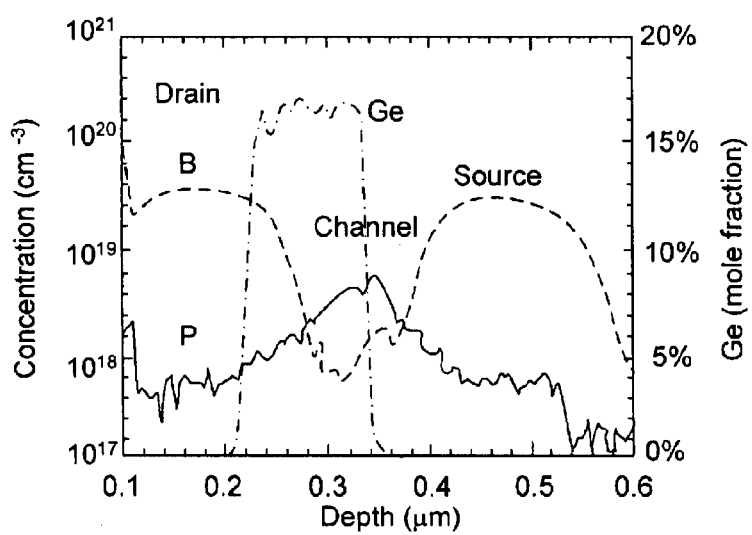
FIG. 5 is a SIMS profile along the channel for the vertical asymmetric SiGe channel in the pMOSFET in accordance with FIG. 1A.

FIG. 5 shows secondary ion mass spectroscopy (SIMS) profiles along the channel of the device of FIG. 1A after processing. The channel is made of Si (~20 nm) and $Si_{0.84}Ge_{0.16}$ (~80 nm). Reactive ion etch was employed to etch the mesa after the epigrowth. The size of the mesa is 20×20 $\mu m^2$. An 8 nm thick intrinsic Si cap was grown around the pillar for gate oxide growth. Gate oxidation was performed at 750° C. in wet $O_2$. The oxide thickness is 5 nm, as measured on a planar (100) Si control wafer oxidized simultaneously with the device wafers.

Figure 6A:
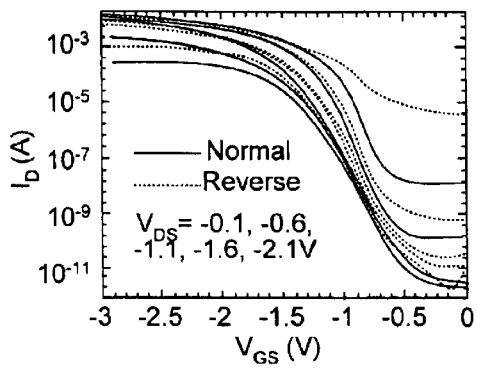
FIG. 6A is a plot of sub threshold characteristics.
Figure 6B:
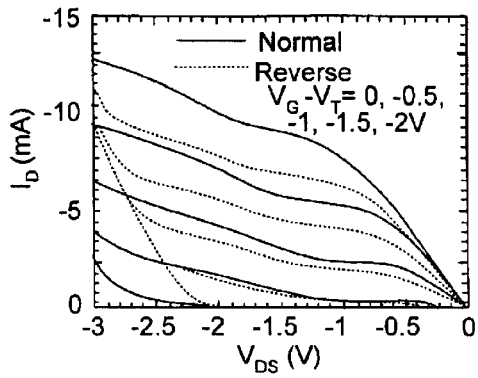
FIG. 6B is a plot of output characteristics for the vertical device of FIG. 1A.

The top p+ layer is used as drain in the "normal" mode. In the "reverse" mode, the source and drain contacts are interchanged. FIG. 6 shows the output characteristics of the asymmetric device measured in the normal and reverse mode. Although, the threshold voltage ($V_T$) in the normal mode is 70 mV higher than that in the reverse mode, the drive current is still larger in the normal mode at the same gate voltage. The device in the reverse mode shows larger drain induced barrier lowering than that in the normal mode. The off-state leakage current in the reverse mode is larger than that in the normal mode. In FIG. 6A, the device shows punchthrough characteristics in the reverse mode at $V_{DS}$=−2.1V. The output characteristics (FIG. 6B) also show that the device has a smaller breakdown voltage in the reverse mode. These observations indicate that the smaller source and channel barrier in the strained $Si_{1-x}Ge_x$ layer can degrade the short channel performance and increase the off-state leakage current, while, in the normal mode, the source-channel junction is made in Si, and the off-state device performance is not degraded.

The disadvantage of the device in the normal mode is that it shows more severe floating body effects than in the reverse mode. At $V_{DS}$=−1.6V, the subthreshold swing is reduced from 150 mV/decade ($V_{DS}$=−0.1V) to 110 mV/decade in the normal mode. From the output characteristics (FIG. 3B), we one can also observe more significant kinks in the normal mode than in the reverse mode, which is also an indication of floating body effects. In the normal mode, the drain junction is in $Si_{1-x}Ge_x$ which has a smaller band gap than Si, and hence more hot carriers are produced by impact ionization in the $Si_{1-x}Ge_x$ layer than in the Si layer. Also, the higher drive current in the normal mode can cause more hot carriers than in the reverse mode, leading to greater floating body effects.

Due to smaller band gap in the strained $Si_{1-x}Ge_x$ layer, $Si_{1-x}Ge_x$ channel MOSFET has a smaller threshold voltage. $V_T$ is dependent on the device parameters on the source side. For the asymmetric $Si_{0.84}Ge_{0.16}$ channel device, the threshold voltage in the normal mode ($V_{T1}$) is 70 mV smaller than the threshold voltage for the pinch-off point, $V_{Dsat}$, depends on the threshold voltage of the channel at the drain side and the gate voltage.

In the normal mode, $$V_{Dsat}=V_G-V_{T1}-70\ mV.$$

In the reverse mode, $$V_{Dsat}=V_G-V_{T2}+70\ mV.$$

It is clear that $V_{Dsat}$ in the normal mode is larger than that in the reverse mode at the same $V_G-V_T$, which results in an improvement of the saturation current in the normal mode compared with that in the reverse mode. This may be useful for low power applications.

Figure 7:
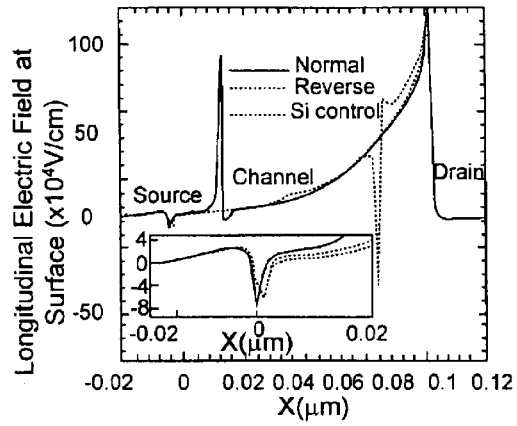
FIG. 7 is a plot of longitudinal electric field along the channel of the device of FIG. 1A.
Figure 8:
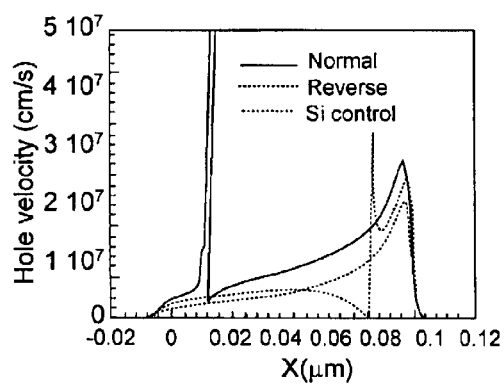
FIG. 8 is a plot of drift velocity of holes in the channel of the device of FIG. 1A.
Figure 9:
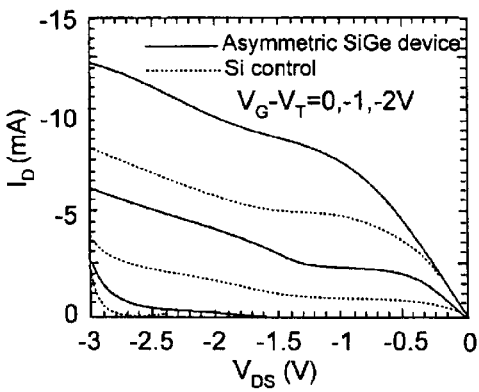
FIG. 9 is a plot of output characteristics for the device of FIG. 1A and a silicon control device.

At the channel length below 100 nm, velocity overshoot takes place over a portion of the device which is confirmed by hydrodynamic simulations. When the carrier velocity near the drain can reach rather high values in the high-field region near the drain, MOSFET currents are mainly controlled by the average velocity near the source end of the channel, and the inversion charge density $Q_i=C_{ox}(V_G-V_T)$, independent of the drain voltage 14. The carriers velocity near the source is determined by the electric field and carrier mobility in the channel region near the source. The mobility of the holes in the source end of the channel of the asymmetric device is low compared with a PMOSFET with strained $Si_{1-x}Ge_x$ everywhere in the channel. But this can be compensated by the kinetic energy enhancement due to the valence band offset at the source end in the asymmetric Si/$Si_{1-x}Ge_x$ device. FIG. 7 shows the electric field along the channel of the asymmetric device operated in the normal and reverse mode and for a Si control device. In the normal mode, due to the potential energy step in the channel, the device shows a larger field gradient near the source end of the channel (inset of FIG. 7). Especially at the step, where thee is a jump in the electric field, the holes injected from the source into the channel will experience a velocity enhancement near the source end. FIG. 8 shows the drift velocity of holes in the channel. Holes have reached velocity overshoot near the drain side in the channel for all the three devices. Near the source side, holes have largest velocity in the normal mode of the asymmetric Si/$Si_{1-x}Ge_x$ due to the step in the channel, which helps the drive current improvement. At the same gate drive, the drive current for the asymmetric Si/$Si_{1-x}Ge_x$ device is higher than the Si control device (FIG.

9). However, the off-state characteristics are almost the same for the two devices.

Figure 10A:
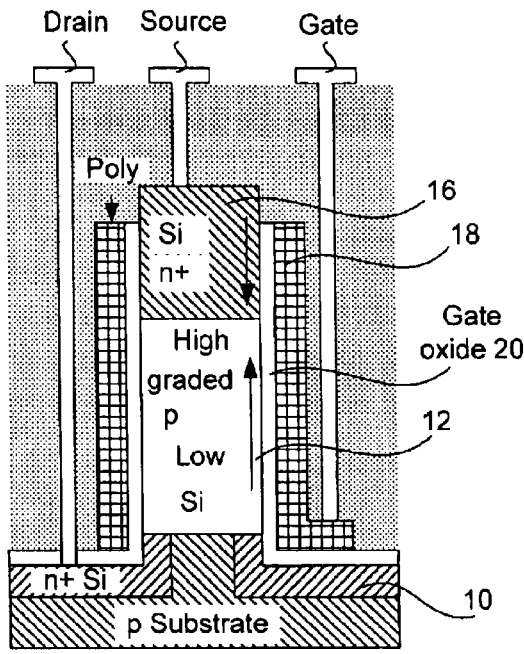
FIGS. 10A and 10B are cross-section schematics of a vertical NMOSFET and a vertical pMOSFET, respectively, in accordance with embodiments of the invention.
Figure 10B:
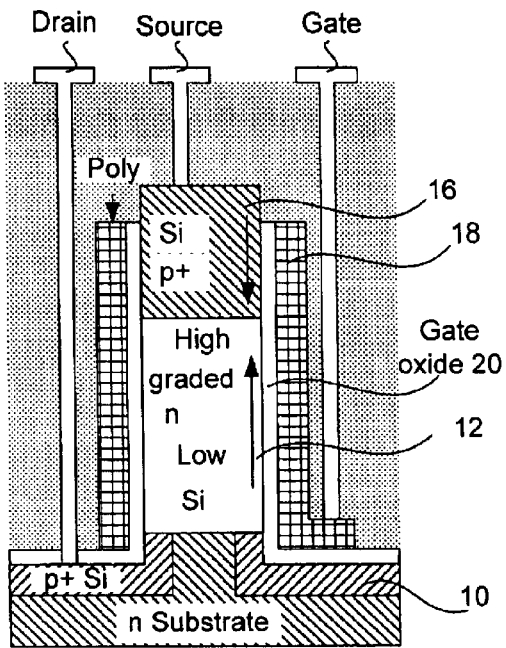

FIGS. 10A, 10B are section views of other embodiments of the invention in which an asymmetric doping profile is employed in the channel region. Again, like reference numerals are used for the same elements in the several views. Here the source region is 16 and the drain region is 10 for ease in fabrication of the graded channel region 12 with higher doping near the source region. FIG. 10A is an n-channel device and FIG. 10B is a p-channel device, otherwise the two devices have similar structures. The graded doping in the channel is formed by in situ doping during chemical vapor deposition or conventional single step ion implantation. The doping is graded in the channel and higher near the source end. With this device structure, the off-state leakage current, drain induced barrier lowering (DIBL) effect, and hot carrier effects can be suppressed significantly while the drive current is improved. With the higher doping near the source, the potential barrier at the source junction is higher and fewer carriers are injected from the source to the channel. Therefore, DIBL and off-state leakage current are reduced.

Hot carrier effects are a significant reliability concern in sub-100 nm device. One most important hot carrier effect is the damage caused to the Si—SiO$_2$ interface which can lead to a time-dependently degradation of the device performance. The origin of all kinds of hot carrier phenomena is the large longitudinal electric field ($E_{max}$) near the drain end of the channel. Electron and hole pairs are generated near the drain with the total number being exponentially dependent on the reciprocal of the $E_{max}$. Therefore, the greatest control over hot carrier effects is exerted by minimizing $E_{max}$. Graded doping channel device can reduce the $E_{max}$ by increasing surface potential more rapidly near the source end instead of the drain end as in conventional devices; therefore, the hot carrier effects are suppressed.

Figure 11:
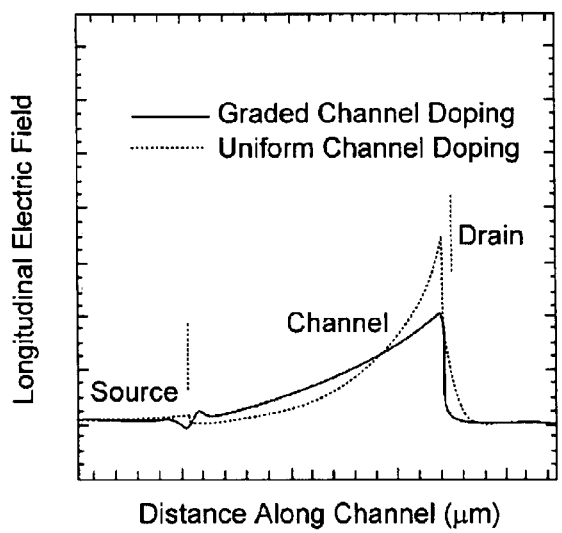
FIG. 11 is a plot of longitudinal electric field along the channel for a device having a graded doping channel and for a uniformly doped channel, respectively.

Graded doping in the channel also increases electric field gradient near the source end of the channel. The electron injected from source into the channel will experience a rapid increase of longitudinal electric field, as shown in FIG. 11. Therefore, the electron velocity rises rapidly at the source end of the channel. At the channel length below 100 nm, velocity overshoot takes place over a portion of the device, which is confirmed by experiment and Monte Carlo simulations. When the carrier velocity near the drain can reach rather high values in the high-field region near the drain, MOSFET currents are mainly controlled by the average velocity near the source end of the channel, and the inversion charge density, independent of the drain voltage. Therefore, there is a potential for the graded doping channel device to enhance the drive current when the channel length is below 100 nm.

The invention as described with reference to specific embodiments is especially useful in very high speed, low leakage sub 100 nm devices. As noted above, the invention is applicable with both p-channel and n-channel structures and with other suitable heterostructure material systems. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A MOSFET semiconductor device comprising a semiconductor body having a silicon source region of one conductivity type, a drain region of the one conductivity type, a channel region comprising silicon and a heterostructure material of opposite conductivity type between the source region and the drain region, the channel region being asymmetrical in profile between the source region and the drain region with the channel being having a non-uniform doping profile with higher doping near the source region and lower doping near the drain region, and a gate for controlling conduction of the channel region.

2. The MOSFET semiconductor device as defined by claim 1 wherein the one conductivity type is p-type.

3. The MOSFET semiconductor device as defined by claim 1 wherein the device comprises a mesa structure on a semiconductor substrate.

4. The MOSFET semiconductor device as defined by claim 1 wherein the device comprises a planar structure in a semiconductor substrate.

5. A MOSFET semiconductor device comprising a semiconductor body having a silicon source region of one conductivity type, a drain region of the one conductivity type, a channel region of opposite conductivity type between the source region and the drain region, comprising silicon and a heterostructure material with the silicon abutting the source region and positioned between the source region and the heterostructure material, the channel region being asymmetrical in profile between the source region and the drain region, and a gate for controlling conduction of the channel region.

6. The MOSFET semiconductor device as defined by claim 5 wherein the heterostructure material comprises $Si_{1-x}Ge_x$.

7. The MOSFET semiconductor device as defined by claim 6 wherein the mole fraction of Ge increases toward the drain region.

8. The MOSFET semiconductor device as defined by claim 7 wherein the mole fraction increases uniformly.

9. The MOSFET semiconductor device as defined by claim 7 wherein the mole fraction increases in steps.

10. A MOSFET semiconductor device comprising:

a) a silicon substrate, b) a source region in the substrate of one conductivity type, c) a drain region of the one conductivity type, d) a channel region of opposite conductivity type between the source region and the drain region, the channel region and the drain region being in a mesa structure extending from the source region and the silicon substrate, the channel region comprising silicon abutting the source region and a heterostructure material abutting the drain region, e) a gate insulator abutting the channel region, and f) a conductive gate abutting the gate insulator for controlling conduction of the channel region.

11. The MOSFET semiconductor device as defined by claim 10 wherein the source region extends into the mesa structure.

12. The MOSFET semiconductor device as defined by claim 10 wherein the heterostructure material comprises $Si_{1-x}Ge_x$.

13. The MOSFET semiconductor device as defined by claim 12 wherein the mole fraction of Ge increases toward the drain region.

14. The MOSFET semiconductor device as defined by claim 13 wherein the mole fraction increases uniformly.

15. The MOSFET semiconductor device as defined by claim 13 wherein the mole fraction increases in steps.

* * * * *